United States Patent [19]

Inagaki et al.

[11] Patent Number: 5,610,443

[45] Date of Patent: Mar. 11, 1997

[54] METHOD FOR ENCAPSULATING A SEMICONDUCTOR UTILIZING AN EPOXY RESIN AND AN ONIUM SALT COMPOUND

[75] Inventors: Akihiro Inagaki; Isao Yamamura, both of Minamiashigara, Japan

[73] Assignee: General Instrument of Taiwan, Ltd., Taipei, Taiwan

[21] Appl. No.: 524,869

[22] Filed: Sep. 7, 1995

[30] Foreign Application Priority Data

Sep. 8, 1994 [JP] Japan .................................. 6-214877

[51] Int. Cl.$^6$ .................................................. H01L 23/29
[52] U.S. Cl. ........................... 257/788; 437/219; 528/89; 528/90; 528/92; 257/793
[58] Field of Search ...................................... 257/787–789, 257/793; 528/89, 90, 92; 437/219

[56] References Cited

U.S. PATENT DOCUMENTS

| | | | |
|---|---|---|---|
| 4,026,862 | 5/1977 | Smith et al. | 260/37 EP |
| 5,095,053 | 3/1992 | Walles et al. | 523/466 |

FOREIGN PATENT DOCUMENTS

| | | | |
|---|---|---|---|
| 0099953 | 4/1990 | Japan | 257/793 |
| 0195064 | 7/1992 | Japan | 257/793 |

*Primary Examiner*—Peter Toby Brown
*Attorney, Agent, or Firm*—Volpe and Koenig, P.C.

[57] ABSTRACT

A method of encapsulating a semiconductor comprising encapsulating a semiconductor in a curable epoxy resin composition comprising a liquid epoxy resin, an inorganic filler, an onium salt compound and an internal releasing agent, and substantially not containing a hardener, and then molding the above composition.

4 Claims, No Drawings

5,610,443

METHOD FOR ENCAPSULATING A SEMICONDUCTOR UTILIZING AN EPOXY RESIN AND AN ONIUM SALT COMPOUND

BACKGROUND OF THE INVENTION

1. FIELD OF THE INVENTION

This invention relates to a method of encapsulating a semiconductor. More specifically, the invention relates to a method of encapsulating a semiconductor by using a rapid curable epoxy resin compound which comprises a liquid epoxy resin or a curable liquid mixture comprising an epoxy resin and a diluent, and substantially does not contain a hardener. This invention also relates to a semiconductor device which comprises a semiconductor encapsulated by the above compound.

2. DESCRIPTION OF RELATED ART

Various resins have been used for encapsulating a semiconductor. In particular, solid epoxy resin molding compounds (EMC) have various characteristics which make them suitable as a encapsulating material such as mechanical characteristics, adhesion properties, moisture resistance properties, electric insulating properties and other properties. These materials have been widely used as an encapsulating resin.

However, solid epoxy resin compounds require a kneading machine and a pulverizing machine which are extremely expensive. Additionally, in order to form an encapsulating layer using a molding machine, a tablet with a different size depending on the respective purposes must be prepared. Further, during molding, a portion of the resin cured in the cull and the runner is lost, thereby decreasing the yield.

In order to cure these epoxy resins, a phenol resin-type hardener such as phenol novolak has been generally used. However, in a system in which such a hardener is used, the reaction rate is relatively slow. Some improvement of the reaction rate has been made, but a sufficient reaction rate has not yet been obtained.

As a hardener of an epoxy resin, amino-type compounds such as polyamine and acid anhydride-type compounds have been used. These compounds not only present adverse health effects to humans, but also lower the reaction rate and exert a negative influence on the electric characteristics of an epoxy resin after curing, since the compounds absorb moisture in air even after they are mixed with the epoxy resin. In order to prevent the above problems, an uncured EMC composition comprising a hardener may be sealed in a plastic bag. However, in a system in which a hardener is mixed, the composition must be kept cool for storage and transportation, thereby complicating the handling of the material.

Alternatively, various liquid epoxy resins have been used. It is difficult to impart a sufficient curing rate to a liquid epoxy resin with satisfactory control, whereby an uncured liquid epoxy resin flows out from a gap of a split of mold during molding to form a large amount of flash, or burrs, which results in a reduced yield.

In order to improve operatability of an epoxy resin, a variety of epoxy resin compositions have been proposed in which a special catalyst is used and all components are stored in a single package. A latent type catalyst is known in the art which is a solid and is not dissolved in an epoxy resin at ambient temperature, but can be dissolved in an epoxy resin and causes a curing reaction abruptly when it is heated nearly to a melting point. Examples of these compounds are boron trifluoride, an amine complex, dicyandiamide and derivatives thereof; organic acid hydrazides such as adipic acid dihydrazide; and others. These epoxy resin compounds exhibit excellent storability at ambient temperature. However, the catalyst is not dissolved in the epoxy resin so that it must be dispersed by pasting. Problems concerning conditions of use are limited in that the apparent viscosity of the system is reduced during thermal curing so that dispersion of the catalyst is unstable and is not uniform, and the reaction proceeds slowly. Alternatively, when a latent type of catalyst is used and the reaction rate is increased by heating, an epoxy resin composition generates heat rapidly, thereby causing deterioration and foaming.

Various onuim salts have been used as a latent type catalyst for curing an epoxy resin. For example, in Japanese Provisional Patent Publication No. 126430/1984, a quaternary ammonium salt or a quaternary phosphonium salt, which is a 2-mercaptothiazole, is used as a catalyst in a composition comprising an epoxy resin, a hardener and an inorganic filler. When the quaternary phosphonium salt is used for encapsulating a semiconductor element having a metal electrode, such as aluminum, corrosion of the electrode can be prevented even if it is used under high temperature and high humidity. However, the problem with this system is that a hardener such as a phenol novolak resin, an amine compound, acid anhydride, or a curing accelerator such as imidazoles is used in a combination. Accordingly, the problems of toxicity and others caused by the above hardeners have not been solved. Additionally, curing of an epoxy resin by an onium salt is so rapid that the reaction may be partially non-uniform and large portions of unreacted hardener may remain.

Japanese Provisional/Patent Publication No. 170116/1984, discloses a reaction product of an aromatic diamine and a quaternary phosphonium salt that is used for curing a liquid epoxy resin. However, in order to obtain a completely cured product in this system, it is necessary to use a curing accelerator such as a tertiary amine, imidazoles or metal acetyl acetonate in combination.

Japanese Provisional Patent Publication No. 228745/1984, discloses that an encapsulating epoxy resin of a semiconductor device can be cured by using an aromatic amine adduct and a quaternary phosphonium salt in combination and molded by heating at a temperature of 150° C. for 30 minutes or at 260° C. for 30 seconds. However, this curing rate is not satisfactory. Further, details of the quaternary phosphonium salt have not been described therein.

Japanese Provisional Patent Publications No. 95315/1987 and No. 212418/1987, disclose an epoxy resin composition which comprises a liquid epoxy resin, a specific imidazole compound as a hardener and a phosphonium halide as a latent-type curing accelerator. This composition has storage stability and a rapid curing rate. However, with a gelling time at 130° C. of 4.5/minutes or longer, the curing rate is unsatisfactory for the present application. When this kind of phosphonium salt is not used in combination with an imidazole compound, the curing rate is slower and is not suitable for encapsulating by molding of a liquid epoxy resin. Alternatively, when an imidazole compound is used in the combination, the imidazole compound is a solid and is not dispersed uniformly. As a result, not only is it not dispersed uniformly, but the solid imidazole compound remains, which causes problems in the molding step. In addition, use of an imidazole chemical material lowers the humidity resistance of an epoxy resin encapsulating layer.

Japanese Provisional Patent Publication No. 115427/1991, discloses a latent-type curing catalyst of a solid epoxy resin comprising a diaryliodonium salt of hexafluoroantimonic acid in combination with a radical-generating aromatic compound such as benzopinacol. This combination imparts excellent humidity resistance to a semiconductor device as an encapsulating compound. However, the diaryliodonium salt has poor stability and is difficult to handle.

Japanese Provisional Patent Publication No. 227419/1990, discloses a polymeric compound having a benzylonium salt structure as a side chain which is used as a latent type hardener of an epoxy resin. This system imparts flexibility and impact resistance to a cured resin composition.

Prior art references have disclosed sulfonium salt having a naphthylmethyl group (Japanese Provisional Patent Publication No. 152619/1988), an α-methylbenzyl group (Japanese Provisional Patent Publication No. 221111/1988) or a 4-alkoxybenzyl group (Japanese Provisional Patent Publication No. 223002/1988). A latent type curing catalyst and such a mechanism of curing an epoxy resin can be applied to an encapsulating material. Also, Japanese Provisional Patent Publication No. 105692/1993, discloses that triphenylbenzylphosphonium hexafluoroantimonate, when used as a latent type curing catalyst of an epoxy resin, does not cause problems of coloring and odor so that it can be applied to an encapsulating material. Further, Japanese provisional Patent Publication No. 96169/1989, discloses that a synthetic method of a benzylpyridinium salt can be used as a latent type curing catalyst of an epoxy resin.

SUMMARY OF THE INVENTION

The present invention provides a method of encapsulating a semiconductor with good yield by heating at relatively low temperature and a short molding cycle, by using an epoxy resin composition which has fluidity, is not required to be mixed with a catalyst immediately before use, can be stored stably at ordinary temperature, does not require a conventional hardener having problems of toxicity and moisture absorption and generates less heat accompanied with a curing reaction, which is suitable for mass production, for example, injection molding or transfer molding.

The present inventors have found that by using an onium salt of hexafluoroantimonic acid having a specific onium structure as a latent-type catalyst, an extremely high curing rate and molding cycle can be obtained to achieve the above object. Further, such an onium salt molecule includes a halogen atom, but it does not exert a negative influence on the characteristics of the encapsulated semiconductor device.

That is, the present invention is concerned with a method of encapsulating a semiconductor, which comprises:

encapsulating a semiconductor in a curable epoxy resin composition comprising:
(A) a liquid epoxy resin or a curable liquid mixture comprising an epoxy resin and a diluent;
(B) an inorganic filler;
(C) an onium salt compound represented by the formula (I) or (II):

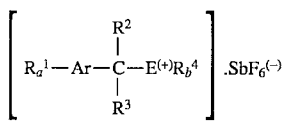

(I)

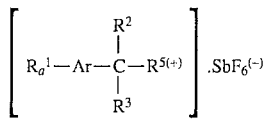

(II)

wherein E represents sulfur, nitrogen or phosphorus; Ar represents an aromatic ring; when a is 2, the $R_a^1$'s are the same as or different from each other and represent a substituted or unsubstituted monovalent hydrocarbon group, a hydroxyl group, an alkoxyl group, a nitro group, a cyano group or a halogen atom; $R^2$ and $R^3$ each represent a hydrogen atom or a methyl group; the $R_b^4$'s are the same or different and represent a substituted or unsubstituted monovalent hydrocarbon group; $R^5$ represents a substituted or unsubstituted pyridinium group; a represents an integer of 0 to 2; and b represents 2 when E is sulfur or represents 3 when E is nitrogen or phosphorus; and (D) an internal releasing agent, and substantially not containing a hardener, and then molding the above composition. The present invention includes a semiconductor device which comprises a semiconductor encapsulated by the above method.

DESCRIPTION OF THE PREFERRED EMBODIMENTS

In the following, the present invention is explained in detail.

Component (A) to be used in the present invention is a polymer component in the curable epoxy resin composition and either (1) a curable liquid epoxy resin which is liquid at ambient temperature or (2) a curable liquid mixture which is liquid or solid at ambient temperature and exhibits a liquid state at ambient temperature by diluting it with a diluent. The epoxy resin may be an epoxy resin having any molecular structure so long as it has two or more oxirane rings in one molecule and is cured in the presence of a catalyst or a hardener to form a resinous polymer. The epoxy resin may be used singly or in combinations of two or more. As described above, a hardener is not substantially used in the present invention.

In the present invention, "liquid at ambient temperature" refers to having fluidity at 25° to 40° C. and a so-called semisolid state is included. A substantially uniform mixture of a liquid epoxy resin at ambient temperature and a solid epoxy resin at ambient temperature, which is liquid at ambient temperature after mixing is included in the liquid epoxy resin mentioned herein.

(1) Epoxy resins which are liquid at ordinary temperature, may be illustrated by a bisphenol A type epoxy resin having an average molecular weight of about 500 or less; a bisphenol F type epoxy resin; a phenol novolak type epoxy resin having an average molecular weight of about 570 or less; an alicyclic epoxy resin such as 1,2-epoxyethyl-3,4-epoxycyclohexane, 3,4-epoxycyclohexylcarboxylic acid-3,4-epoxycyclohexylmethyl and bis(3,4-epoxy-6-methylcyclohexylmethyl)adipate, a glycidyl ester type epoxy resin such as diglycidyl hexahydrophthalate, diglycidyl 3-methyl hexahydrophthalate and diglycidyl hexahydroterephthalate; a glycidylamine type epoxy resin such as diglycidyl aniline, diglycidyl toluidine, triglycidyl-p-aminophenol, tetraglycidyl-m-xylylenediamine and tetraglycidyl bis(aminomethyl)cyclohexane; and a hydantoin type epoxy resin such as 1,3-diglycidyl-5-methyl-5-ethylhydantoin.

(2) As a main component, diluted by a diluent of the curable liquid composition, a solid epoxy resin may be used in addition to the above liquid epoxy resin. The epoxy resin used may include the following: bisphenol A type epoxy resin, a bisphenol F type epoxy resin, a novolak type epoxy resin, an alicyclic epoxy resin, a glycidyl ester type epoxy resin, a glycidylamine type epoxy resin, a triazine type epoxy resin and a hydantoin type epoxy resin.

The diluent may be any diluent so long as it can dissolve or disperse the epoxy resin and the system can maintain fluidity. It may be either a reactive diluent which participates in a curing reaction by Component (C) or a non-reactive diluent.

The reactive diluent is an epoxy compound having at least one oxirane ring in one molecule and having relatively low viscosity at ambient temperature, and may have another polymerizable functional group. For example, an alkenyl group such as vinyl and allyl, or an unsaturated carboxylic acid residue such as acryloyl and methacryloyl may be used in addition to the oxirans ring(s), depending on the purpose. The reactive diluent may include a monoepoxide compound such as n-butyl glycidyl ether, 2-ethylhexyl glycidyl ether, phenyl glycidyl ether, cresyl glycidyl ether, p-secbutylphenyl glycidyl ether, styrene oxide and α-pinene oxide; a monoepoxide compound having other functional group such as allyl glycidyl ether, glycidyl methacrylate and 1-vinyl-3,4-epoxycyclohexane; a diepoxide compound such as (poly)ethylene glycol diglycidyl ether, (poly)propylene glycol glycidyl ether, butanediol diglycidyl ether and neopentyl glycol diglycidyl ether and a triepoxide compound such as trimethylolpropane triglycidyl ether and glycerin triglycidyl ether.

The non-reactive diluent may include an aromatic hydrocarbon having a high boiling point such as pcymene and tetralin glycerin; an alcohol having a high boiling point such as 2-methylcyclohexanol; and a plasticizer such as dibutyl phthalate, dioctyl phthalate and dibutylbenzyl phosphate. (The diluent may be used in an amount of 40% by weight or less of the amount of the whole curable liquid composition (2) without any problem.) An organic solvent having a lower boiling point such as xylene, methyl ethyl ketone and methyl isobutyl ketone may be used if the amount is in the range of 10% by weight or less, but preferably 2% by weight or less of the whole (2). However, when such an organic solvent is used, the curing operation should be carried out with care since bubbling and thinning may result.

Component (B) is used in the present invention to make shrinkage smaller when the composition is cured, to impart suitable mechanical characteristics, to impart thermal conductivity to the encapsulating material after curing, and to make the expansion coefficient smaller. As Component (B), the following may be used: silica powder such as fused silica including pulverized silica and spherical silica, fumy silica and precipitated silica; and powders of alumina, titania, zirconia, antimony oxide, aluminum hydroxide, calcium carbonate, glass beads, boron nitride, aluminum carbide, aluminum nitride, silicon carbide, silicon nitride, silicon nitrocarbide, titanium carbide, titanium nitride. Fused silica is preferred since it has the expansion coefficient of a molded encapsulating layer and having relatively high purity, is relatively easily available and the apparent increase viscosity of an uncured system is small.

The amount of Component (B) used is generally 50 to 1,000 parts by weight, preferably 200 to 500 parts by weight based on 100 parts by weight of the epoxy resin, or the total amount of the epoxy resin and the reactive diluent in Component (A). If the amount is less than 50 parts by weight, sufficient effects cannot be obtained. If Component (B) is formulated in an amount exceeding 1,000 parts by weight, the composition has poor fluidity, whereby it is difficult to mold the composition.

Component C is a latent-type catalyst which functions as a catalyst for curing the epoxy resin by heating, or as a catalyst for curing the epoxy resin and the reactive diluent by heating when the reactive diluent is formulated in Component (A).

Component C is represented by the formula (I) or (II):

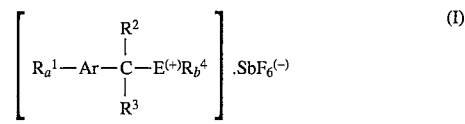
(I)

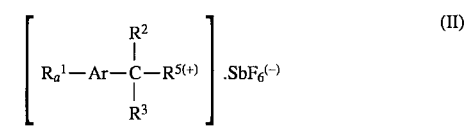
(II)

wherein E, Ar, $R^1$, $R^2$, $R^3$, $R^4$, $R^5$, a and b have the same meanings as defined above, and is a onium hexafluoroantimonate having an aromatic ring Ar bonded to a hetero atom which is sulfur, nitrogen or phosphorous through $—C(R^2R^3)—$. Ar may be illustrated by a benzene ring, a naphthalene ring, an anthracene ring and a pyrene ring. A benzene ring is preferred since it can be synthesized easily.

Component (C), represented by the formula (I), may be illustrated by: sulfonium, ammonium or phosphonium having an arylmethyl group such as benzyl, α-methylbenzyl, 1-naphthylmethyl and 2-naphthylmethyl. Component (C) represented by the formula (II), may be illustrated by the respective hexafluoroantimonates of the same hydrocarbons such as pyridinium. The above aromatic ring and/or pyridinium ring may be substituted. It is particularly preferred to introduce a specific polar group depending on each ring since large catalytic activity can be obtained. A hexafluoroantimonate of sulfonium or ammonium is preferred since it is very active and its storage stability and curing rate can be set as desired depending on the purpose by selecting $R^1$ and $R^4$ suitably from the wide range thereof.

The aromatic ring Ar may be unsubstituted or may be substituted by one or two $R^1$(s). $R^1$ may be illustrated by a straight or branched alkyl group such as methyl, ethyl, propyl, butyl, pentyl, octyl, decyl, dodecyl and tetradecyl; a cycloalkyl group such as cyclohexyl; an aryl group such as phenyl and naphthyl; an alkaryl group such as tolyl and xylyl; an aralkyl group such as benzyl and 2-phenylethyl; an alkenyl group such as vinyl, allyl and butenyl; a monovalent substituted hydrocarbon group such as chloromethyl; a hydroxyl group; an alkoxyl group such as met oxy, ethoxy, propoxy and t-butoxy; a nitro group; a cyano group; and a halogen atom such as fluorine, chlorine, bromine and iodine. When a phosphonium salt and a pyridinium salt having relatively low activity are used, it is preferred that $R^1$ is an electron-withdrawing group or a halogen atom since a high curing rate can be obtained. The position into which $R^1$ is introduced is optional. (However, when the case where Ar is a benzene ring, the position is preferably 2-position and/or 4-position since the compound can be synthesized easily.) When $R^1$ is a bulky group, the 4-position is particularly preferable since there is no lowering of activity caused by steric hindrance.

$R^2$ and $R^3$ are independently a hydrogen atom or a methyl group. Hydrogen atoms are preferred since the compound can be easily synthesized. When catalytic activity is required to be increased, it is preferred that at least one of $R^2$ and $R^3$ be a methyl group.

$R^4$ may be illustrated by the following: a straight or branched alkyl group such as methyl, ethyl, propyl, butyl, pentyl, octyl, decyl, dodecyl and tetradecyl; a cycloalkyl group such as cyclohexyl; an aryl group such as phenyl and naphthyl; an alkaryl group such as tolyl and xylyl; an aralkyl group such as benzyl and 2-phenylethyl; an alkenyl group such as vinyl, allyl, butenyl; and a monovalent substituted hydrocarbon group such as hydroxyphenyl, methoxyphenyl, ethoxyphenyl, cyanophenyl, chlorophenyl, acetoxyphenyl, propanoylphenyl, methoxycarbonylphenyl and ethoxycarbonylphenyl.

$R^5$ may be illustrated by the following: a substituted or unsubstituted pyridinium group such as pyridinium, 2- or 4-methylpyridinium, 2,4-dimethylpyridinium, 2- or 4-cyanopyridinium, 2- or 4-methoxycarbonylpyridinium and 2 - or 4-ethoxycarbonylpyridinium. It is preferable that $R^5$ has a nucleophilic group such as a cyano group at 2-position or 4-position because of high activity.

As a representative example of Component (C) described above, the following may be used: a sulfonium salt such as dimethylbenzylsulfonium hexafluoroantimonate, dimethyl(4-methylbenzyl)sulfonium hexafluoroantimonate, dimethyl(4-methoxybenzyl)sulfonium hexafluoroantimonate, dimethyl(4-ethoxybenzyl)sulfonium hexafluoroantimonate, dimethyl(4-t-butoxybenzyl)sulfonium hexafluoroantimonate, dimethyl(4-nitrobenzyl)sulfonium hexafluoroantimonate, dimethyl(4-cyanobenzyl)sulfonium hexafluoroantimonate, (4-chlorobenzyl)sulfonium hexafluoroantimonate, methylphenylbenzylsulfonium hexafluoroantimonate, methyl(4-hydroxyphenyl)benzylsulfonium hexafluoroantimonate, methyl(4-methoxyphenyl)benzylsulfonium hexafluoroantimonate, dimethyl(1-naphthylmethyl)sulfonium hexafluoroantimonate, methyl phenyl(1-naphthylmethyl)sulfonium hexafluoroantimonate, methyl(4-hydroxyphenyl)(1-naphthylmethyl)sulfonium hexafluoroantimonate, methyl(4-methoxyphenyl)(1-naphthylmethyl)sulfonium hexafluoroantimonate, dimethyl(α-methylbenzyl)sulfonium hexafluoroantimonate, etc.; an ammonium salt such as trimethylbenzylammonium hexafluoroantimonate, dimethylphenylbenzylammonium hexafluoroantimonate, dimethylphenyl(4-hydroxybenzyl)ammonium hexafluoroantimonate, dimethylphenyl(2-methyl-4-hydroxybenzyl)ammonium hexafluoroantimonate, dimethylphenyl(4-methoxybenzyl)ammonium hexafluoroantimonate, (4-nitrobenzyl)ammonium hexafluoroantimonate, (4-cyanobenzyl)ammonium hexafluoroantimonate, (4-chlorobenzyl)ammonium hexafluoroantimonate, etc.; a phosphonium salt such as triphenylbenzyl phosphonium hexafluoroantimonate, triphenyl(4-nitrobenzyl)phosphonium hexafluoroantimonate, (4-chlorobenzyl) phosphonium hexafluoroantimonate, etc.; and a pyridium salt such as (4-methoxybenzyl)phosphonium pyridinium hexafluoroantimonate, (4-nitrobenzyl)pyridinium hexafluoroantimonate, (4- chlorobenzyl)pyridinium hexafluoroantimonate, benzyl -4-cyanopyridinium hexafluoroantimonate, (4-methylbenzyl)-4-cyanopyridinium hexafluoroantimonate, (4-t-butylbenzyl)-4-cyanopyridinium hexafluoroantimonate, (4-methoxybenzyl)-4-cyanopyridinium hexafluoroantimonate, (4-chlorobenzyl)-4-cyanopyridinium hexafluoroantimonate, (α-methylbenzyl)-4-cyanopyridinium hexafluoroantimonate, benzyl-2-cyanopyridinium hexafluoroantimonate, (α-methylbenzyl)-2-cyanopyridinium hexafluoroantimonate , 4-methoxycarbonylpyridinium hexafluoroantimonate, etc.

The amount of Component (C) to be used is generally 0.05 to 10 parts by weight, preferably 0.5 to 5 parts by weight, more preferably 0.8 to 3 parts by weight based on 100 parts by weight of the epoxy resin, or the total amount of the epoxy resin and the reactive diluent in Component (A). If the amount is less than 0.05 part by weight, a satisfactory curing rate cannot be obtained. If Component (C) is formulated in an amount exceeding 10 parts by weight, insufficient effects are obtained and the stability of the system in an uncured state and the physical properties of an encapsulating layer after curing is decreased.

Component (D) is formulated for the purpose of facilitating mold release after molding, particularly injection molding or transfer molding of the epoxy resin composition. Component (D) may be illustrated by the following: silicone oil, a fluorine type surfactant, waxes, fluid paraffin, a metal salt of stearic acid, etc. The amount of Component (D) varies depending on the additive used for Component (D), but it is generally 0.05 to 10 parts by weight, preferably 0.5 to 3 parts by weight based on 100 parts by weight of Component (A). If the amount is less than 0.05 part by weight, sufficient mold release property cannot be obtained after curing. If it exceeds 10 parts by weight, the surface of the resulting semiconductor device is slippery or has poor marking property.

In the epoxy resin compound comprising Components (A), (B), (C) and (D) described above, additives such as inorganic fibers, a flame retardant, a flame-retardant additive, a silane or titanium coupling agent, a pigment, a dye, etc. may be formulated, if necessary.

The epoxy resin composition is essentially free of epoxy resin hardeners such as a phenol novolak resin, an amino type compound or an acid anhydride compound, whereby the problems of nonuniformity of curing, toxicity and water absorption caused by a hardener can be prevented.

The epoxy resin compound to be used in the present invention comprises a liquid Component (A). Accordingly, the composition can be easily prepared by mixing the respective components uniformly at ambient temperature or under mild heating at 40° C. or lower by using a stirrer such as a kneader. Although the composition comprises Component (C) which functions as a catalyst, it is stable at ambient temperature and can be stored for a long period of time, for example, for 15 to 60 days or longer.

In the present invention, an encapsulating layer can be molded and cured so as to encapsulate an electric part in a mold into which the electric part is inserted, preferably by injection molding or transfer molding. For example, a conventional RIM injection molding machine or transfer molding machine may be used generally at 120° to 190° C., preferably 130° to 180° C. The curing time is not particularly limited and it can be set as desired depending on the resin composition, the size and shape of an encapsulating material, and the molding temperature. However, the curing rate of the epoxy resin at the above molding temperature is extremely rapid so that the gelling time is 20 seconds or shorter, preferably 1 to 3 seconds, at a temperature of 180° C., and 60 seconds or shorter, preferably 20 seconds or shorter, at a temperature of 150° C.

According to the present invention, a semiconductor can be encapsulated by curing in a relatively short time with an epoxy resin compound obtained by using a liquid epoxy resin, or a curable liquid mixture comprising an epoxy resin which is made liquid by a diluent and formulating a catalyst. The epoxy resin compound can be easily prepared by using a conventional machine for mixing liquid components and can be stored stably for a long period of time. The method of the present invention, allows a semiconductor to be encapsulated effectively and with a high yield for a short curing time by a short molding cycle, without previously preparing a tablet before molding. During curing, less exothermic temperature (or heat) is generated so that deterioration and bubbling of an encapsulating layer due to generation of heat are prevented.

The molecule of the catalyst used in the present invention has a halogen atom, however, no adverse influence by the halogen atom is exerted on characteristics of a semiconductor. Further, since a conventional hardener is not used the toxicity of the compound is reduced and there is no moisture absorption caused by a remaining hardener. Thus, the encapsulating method of the present invention can be widely applied to encapsulating of semiconductors of a diode, a transistor, IC (an integrated circuit), LSI (a large scale integrated circuit), VLSI (a very large scale integrated circuit), etc.

EXAMPLES

The present invention is described in detail by referring to Examples and Comparative examples in Tables 1, 2 and 3, but the present invention is not limited thereby. In Examples and Comparative examples, "part" represents "part by weight" and "%" of a composition represents "% by weight".

In Examples and Comparative examples, the following epoxy resins were used as Component (A).

A-1: a bisphenol A-epichlorohydrin type liquid epoxy resin having a molecular weight of 380;

A-2: a bisphenol A-epichlorohydrin type liquid epoxy resin having a molecular weight of 380, a purified product;

A-3: 3,4-epoxycyclohexanecarboxylic acid-3,4-epoxycyclohexyl;

A-4: a curable liquid mixture comprising 88% of a phenol novolak epoxy type solid epoxy resin having a molecular weight of 600 and 12% of phenyl glycidyl ether; and A-5: a cresol novolak epoxy solid resin (for comparison).

In Examples and Comparative examples, the following compounds were used as Component (C) and a hardener and curing catalyst for comparison.

C-1: dimethylphenyl(4-methoxybenzyl)ammonium hexafluoroantimonate;

C-2: methyl(4-methoxyphenyl)(1-naphthylmethyl)sulfonium hexafluoroantimonate;

C-3: methyl(4-hydroxyphenyl)benzylsulfonium hexafluoroantimonate;

C-4: triphenyl(4-chlorobenzyl)phosphonium hexafluoroantimonate;

C-5: (α-methylbenzyl)-2-cyanopyridinium hexafluoroantimonate as Component (C);

C-6: triethylbenzylphosphonium chloride;

C-7: a phenol novolak resin;

MHHPA: methylhexahydrophthalic anhydride;

DICY: dicyandiamide;

2E4MZ: 2-ethyl-4-methylimidazole;

2E4MZCNS: trimellitic acid-1-cyanoethyl-2-ethyl-4-methylimidazolium; and

2P4MHZ: 2-phenyl-4-methyl-5-hydroxymethylimidazole as a hardener and curing catalyst for comparison.

EXAMPLES 1 TO 11 AND COMPARATIVE EXAMPLES 1 TO 3

According to the formulation ratios shown in Table 1, Component (A) and Component (C) were mixed at ambient temperature to obtain uniform mixtures. In Example 3, after C-2 was completely dissolved in A-1 by heating up to 60° C., the resulting solution was cooled to ambient temperature. As to the mixture samples obtained as described above, gelling times were measured on hot plates set at 150° C. and 180° C. The results are shown in Table 1.

TABLE 1

| Formulation (part) | Example | | | | | | | | | | | Comparative example | | |
|---|---|---|---|---|---|---|---|---|---|---|---|---|---|---|
| | 1 | 2 | 3 | 4 | 5 | 6 | 7 | 8 | 9 | 10 | 11 | 1 | 2 | 3 |
| A-1 | 100 | | | | 100 | 100 | | 100 | | 100 | | 100 | 100 | 100 |
| A-2 | | 100 | | | | | 100 | | | | | | | |
| A-3 | | | 100 | | | | | | 100 | | 100 | | | |
| A-4 | | | | 100 | | | | | | | | | | |
| C-1 | 1 | 1 | 1 | 1 | | | | | | | | | | |
| C-2 | | | | | 1 | | | | | | | | | |
| C-3 | | | | | | 1 | 1 | | | | | | | |
| C-4 | | | | | | | | 2 | 2 | | | | | |
| C-5 | | | | | | | | | | 1 | 1 | | | |
| C-6 | | | | | | | | | | | | 2 | 1 | |
| C-7 | | | | | | | | | | | | | | 50 |
| 2E4MZCNS | | | | | | | | | | | | | | 1 |
| 2P4MHZ | | | | | | | | | | | | | 4 | |
| Gelling time (s) | | | | | | | | | | | | | | |
| 150° C. | 26 | 20 | 3 | 27 | 41 | 43 | 45 | 44 | 8 | 39 | 10 | >240 | 140 | 130 |
| 180° C. | 10 | 10 | 1 | 11 | 15 | 16 | 15 | 18 | 3 | 14 | 2 | >240 | 50 | 45 |

EXAMPLES 12 AND 13 AND COMPARATIVE EXAMPLES 4 AND 5

According to the formulation ratios shown in Table 2, A-1 and fused silica, having an average particle size of 30 μm and a maximum particle size of 130 μm were mixed, and other components were then added to the mixtures. The resulting mixtures were stirred at ambient temperature until the mixtures became uniform in order to prepare curable epoxy resin compounds. As to the compositions obtained, as described above, gelling times were measured on a hot plate set at 180° C. The results are shown in Table 2. Table 2 indicates the compositions used in the present invention were cured in an extremely short time.

TABLE 2

| Formulation (part) | Example | | Comparative example | |
|---|---|---|---|---|
|  | 12 | 13 | 4 | 5 |
| A-1 | 100 | 100 | 100 | 100 |
| C-1 | 1 |  |  |  |
| C-3 |  | 1 |  |  |
| C-7 |  |  | 50 |  |
| DICY |  |  |  | 5 |
| 2E4MZ |  |  | 1 |  |
| 2E4MZCNS |  |  |  | 10 |
| Fused silica | 250 | 250 | 390 | 280 |
| Carnauba wax | 2 | 2 | 3 | 2 |
| Gelling time (s) 180° C. | 11 | 14 | 40 | 140 |

By using the compositions prepared in Example 12 and Comparative example 4, each comprising the liquid epoxy resin A-1 as a main component among the compositions obtained above, a semiconductor was encapsulated by using a low pressure transfer molding machine. After a semiconductor element was placed at a predetermined position of a cavity of a metal mold with a temperature set at 185° C., each of the above epoxy resin compositions was then transferred to the above cavity under conditions of a pressure of 42 kg/cm² (600 psi) with a molding cycle of 20 seconds and cured within said cycle time to form an encapsulating layer of the semiconductor.

As a result, the composition of the present invention prepared in Example 12 was cured completely to form an excellent encapsulating layer without forming flashes. In contrast, the composition of Comparative example 4 was not cured and did not form an encapsulating layer. Further, an uncured composition flowed out to form a large amount of flashes.

EXAMPLES 14 AND COMPARATIVE EXAMPLES 6 AND 7

According to the formulation ratios shown in Table 3, Component (A) and fused silica with an average particle size of 30 μm and a maximum particle size of 130 μm were mixed, and then other components were added. The resulting mixtures were stirred at ambient temperature until the mixtures became uniform so as to allow preparation of curable epoxy resin compositions. The compositions obtained, as described above, were cured by using a differential scanning calorimeter while heating at a temperature-elevating rate of 2° C./min to determine calorific peaks. The results are shown in Table 3. As shown in Table 3, with the composition used in the present invention, calorific value by curing was small.

TABLE 3

| Formulation (Part) | Example | Comparative example | |
|---|---|---|---|
|  | 14 | 6 | 7 |
| A-1 | 100 | 100 |  |
| A-5 |  |  | 100 |
| C-3 | 1 |  |  |
| C-7 |  |  | 50 |
| MHHPA |  | 100 |  |
| 2E4MZ |  | 1 | 1 |
| Fused silica | 250 | 500 | 400 |
| Carnauba wax | 2 | 3 | 3 |
| Calorific peak (°C.) | 118 | 147 | 165 |

We claim:

1. A method of encapsulating a semiconductor, which comprises:

encapsulating a semiconductor in a curable epoxy resin composition comprising:
(A) a liquid epoxy resin or a curable liquid mixture comprising an epoxy resin and a diluent;
(B) an inorganic filler;
(C) an onium salt compound represented by the formula (I) or (II):

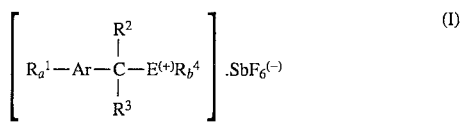

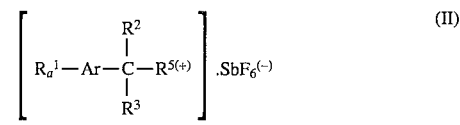

wherein E represents sulfur, nitrogen or phosphorus; Ar represents an aromatic ring; when a is 2, the $R_a^1$'s are the same or different and represent a substituted or unsubstituted monovalent hydrocarbon group, a hydroxyl group, an alkoxyl group, a nitro group, a cyano group or a halogen atom; $R^2$ and $R^3$ each represent a hydrogen atom or a methyl group; the $R_b^4$'s are the same or different and represent a substituted or unsubstituted monovalent hydrocarbon group; $R^5$ represents a substituted or unsubstituted pyridinium group; a represents an integer of 0 to 2; and b represents 2 when E is sulfur or represents 3 when E is nitrogen or phosphorus; and (D) an internal releasing agent,
and substantially not containing a hardener, and then molding the above composition.

2. The method according to claim 1, wherein molding is carried out by injection molding or transfer molding.

3. The method according to claim 1, wherein molding is carried out at 120° to 190° C.

4. A semiconductor device which comprises a semiconductor encapsulated by the method according to claim 1.

* * * * *

UNITED STATES PATENT AND TRADEMARK OFFICE
CERTIFICATE OF CORRECTION

PATENT NO.    : 5,610,443

DATED         : March 11, 1997

INVENTOR(S)   : Inagaki et al

It is certified that error appears in the above-identified patent and that said Letters Patent is hereby corrected as shown below:

On the title page, item [73] add co-assignee, --Nippon Pelnox Corporation
Tokyo, Japan--

Signed and Sealed this

Sixteenth Day of December, 1997

*Attest:*

BRUCE LEHMAN

*Attesting Officer*      *Commissioner of Patents and Trademarks*